(12) United States Patent
Lee et al.

(10) Patent No.: US 11,362,304 B2
(45) Date of Patent: Jun. 14, 2022

(54) DISPLAY DEVICE AND METHOD OF MANUFACTURING THE SAME

(71) Applicant: LG Display Co., Ltd., Seoul (KR)

(72) Inventors: Kwonhyung Lee, Seoul (KR); Chanwoo Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/937,101

(22) Filed: Jul. 23, 2020

(65) Prior Publication Data
US 2020/0358031 A1 Nov. 12, 2020

Related U.S. Application Data

(62) Division of application No. 15/784,539, filed on Oct. 16, 2017, now abandoned.

(30) Foreign Application Priority Data

Oct. 24, 2016 (KR) .......................... 10-2016-0138426

(51) Int. Cl.
*H01L 51/52* (2006.01)
*H01L 27/32* (2006.01)
(Continued)

(52) U.S. Cl.
CPC .......... *H01L 51/5253* (2013.01); *H01L 25/18* (2013.01); *H01L 25/50* (2013.01);
(Continued)

(58) Field of Classification Search
CPC ..... H01L 51/5253; H01L 25/18; H01L 25/50; H01L 27/3276; H01L 51/0097; G09G 2330/04
See application file for complete search history.

(56) References Cited

U.S. PATENT DOCUMENTS 7,746,439 B2 6/2010 Kohno
2002/0113549 A1 8/2002 Yamazaki et al.
(Continued)

FOREIGN PATENT DOCUMENTS

CN 101997023 A 3/2011
CN 102237391 A 11/2011
(Continued)

OTHER PUBLICATIONS

Li et al. "Optimal parameter design for chip-on-film technology using the Taguchi method" in International Journal of Advanced Manufacturing Technologies vol. 25, pp. 145-153. Published by Springer-Verlag London Limited in 2004. (Year: 2004).*
(Continued)

*Primary Examiner* — Tuan A Hoang

(74) *Attorney, Agent, or Firm* — Morgan, Lewis & Bockius LLP

(57) ABSTRACT

A display device and a method of manufacturing the same are provided. A display device includes: a plastic substrate including: a display portion including organic light emitting diodes, and a pad portion including chip-on-films, a lower protective member attached to an entire lower surface of the plastic substrate, and an upper protective member attached to an upper surface of the plastic substrate, the upper protective member covering at least the display portion and both edges of the pad portion.

18 Claims, 18 Drawing Sheets

(51) Int. Cl.
  *H01L 25/18* (2006.01)
  *H01L 25/00* (2006.01)
  *H01L 51/00* (2006.01)
  *G09G 3/3233* (2016.01)
  *G09G 3/3266* (2016.01)
  *G09G 3/3275* (2016.01)

(52) U.S. Cl.
  CPC ...... *H01L 27/3255* (2013.01); *H01L 27/3276* (2013.01); *H01L 51/0097* (2013.01); *G09G 3/3233* (2013.01); *G09G 3/3266* (2013.01); *G09G 3/3275* (2013.01); *G09G 2310/08* (2013.01); *G09G 2330/021* (2013.01); *G09G 2330/04* (2013.01); *H01L 27/322* (2013.01); *H01L 2227/323* (2013.01); *H01L 2251/5338* (2013.01); *Y02E 10/549* (2013.01)

(56) References Cited

U.S. PATENT DOCUMENTS

| | | | |
|---|---|---|---|
| 2006/0022969 | A1 | 2/2006 | Lee |
| 2008/0179594 | A1* | 7/2008 | Oh .................. H01L 51/003 257/59 |
| 2010/0001307 | A1 | 1/2010 | Reynolds et al. |
| 2011/0037059 | A1* | 2/2011 | Gyoda ............. H01L 27/3276 445/25 |
| 2011/0260166 | A1 | 10/2011 | Kim |
| 2013/0299789 | A1* | 11/2013 | Yamazaki ........ H01L 51/5237 257/40 |
| 2014/0217397 | A1 | 8/2014 | Kwak |
| 2014/0254479 | A1 | 9/2014 | Abraham |
| 2014/0306941 | A1 | 10/2014 | Kim et al. |
| 2014/0320779 | A1 | 10/2014 | Noumi |
| 2014/0375534 | A1 | 12/2014 | Lee |
| 2016/0155966 | A1 | 6/2016 | Kim |
| 2016/0187570 | A1 | 6/2016 | Jung |
| 2016/0359137 | A1* | 12/2016 | Chen ................ H01L 25/50 |
| 2017/0003568 | A1* | 1/2017 | Nishi ............... H01L 51/524 |
| 2017/0263891 | A1* | 9/2017 | Oh .................. H01L 51/5284 |
| 2017/0287814 | A1* | 10/2017 | Kim ................. H01L 23/4985 |
| 2018/0277573 | A1* | 9/2018 | Emori ............... B32B 9/045 |

FOREIGN PATENT DOCUMENTS

| | | |
|---|---|---|
| CN | 104091821 A | 10/2014 |
| CN | 104658972 A | 5/2015 |
| JP | 2008-242249 A | 10/2008 |
| JP | 2009-115942 A | 5/2009 |
| JP | 2010-231979 A | 10/2010 |
| JP | 2011-044375 A | 3/2011 |
| JP | 2011-113704 A | 6/2011 |
| JP | 2011-128481 A | 6/2011 |
| JP | 2015-103389 A | 6/2015 |
| KR | 10-1258261 B1 | 4/2013 |
| KR | 10-2015-0000926 U | 3/2015 |
| KR | 10-2016-0066105 A | 6/2016 |
| TW | 201440582 A | 10/2014 |
| WO | 2007/142065 A1 | 12/2007 |
| WO | 2015/114960 A1 | 8/2015 |
| WO | 2016/127642 A1 | 8/2016 |

OTHER PUBLICATIONS

Japanese Office Action dated Dec. 17, 2019, issued in corresponding Japanese Patent Application No. 2017-204876.
Indian Office Action dated Jan. 1, 2020, issued in corresponding Indian Patent Application No. 201714037563.
Taiwanese Office Action dated Apr. 24, 2018, for corresponding Taiwanese patent application No. 106135651.
German Office Action dated Oct. 1, 2018, for corresponding German patent application No. 102017124796.3.
Japanese Office Action dated Oct. 18, 2018, for corresponding Japanese Patent Application No. 2017-204876.
Chinese Office Action dated Mar. 18, 2019, issued in corresponding Chinese Patent Application No. 201710948441.8.

\* cited by examiner

DISPLAY DEVICE AND METHOD OF MANUFACTURING THE SAME

CROSS-REFERENCE TO RELATED APPLICATIONS

This application is a divisional application of U.S. patent application Ser. No. 15/784,539, filed Oct. 16, 2017, which claims the priority of Korean Application No. 10-2016-0138426, filed on Oct. 24, 2016, the entirety of both which are hereby incorporated by reference.

BACKGROUND

1. Technical Field

The present disclosure relates to a display device, and, more particularly, to display device for preventing damage of a plastic substrate, and a method of manufacturing the same.

2. Discussion of the Related Art

With the development of an information society, demands for display devices displaying an image are increasing in various ways. In the field of the display devices, a large-sized cathode ray tube (CRT) display has been rapidly replaced by a flat panel display (FPD) having advantages of a thin profile, light weight, and a large-sized screen. Examples of the flat panel display include a liquid crystal display (LCD), a plasma display panel (PDP), an organic light-emitting diode (OLED) display, and an electrophoresis display (EPD).

An OLED display includes self-emitting elements capable of emitting light by themselves, and has advantages of a fast response time, a high emission efficiency, a high luminance, and a wide viewing angle. In particular, the OLED display can be manufactured on a flexible plastic substrate. The OLED display has additional advantages of a lower driving voltage, lower power consumption, and better color tone as compared to a plasma display panel or an inorganic electroluminescent display.

In an OLED display manufactured on a flexible plastic substrate, polyimide is coated on a glass substrate; elements, such as an organic light-emitting diode including a thin film transistor, an organic layer, etc. are manufactured; and a flexible printed circuit board, such as a chip-on-film (COF), is attached to a pad portion. A process for separating the glass substrate is performed, and then protective films are attached to an upper part and a lower part of a panel, thereby manufacturing the OLED display including a flexible polyimide substrate.

FIGS. 1 and 2 are cross-sectional views of an OLED display according to a related art. FIG. 3 is an image illustrating a damaged pad portion in a related art.

With reference to FIGS. 1 and 2, an OLED display according to a related art is configured such that an upper protective film UP and a lower protective film LP are respectively attached to a front surface and a back surface of a plastic substrate PI on which elements, such as an organic light-emitting diode, are formed, a chip-on-film COF is attached to a pad portion PD positioned on one side of the plastic substrate PI, and a resin layer RE is coated on the pad portion PD to protect the pad portion PD. However, because the pad portion PD or an edge of the plastic substrate PI is exposed to the outside of the upper and lower protective films UP and LP, there is a problem that the plastic substrate PI is easily torn out by an external impact. For example, as shown in FIG. 3, the pad portion PD was entirely torn out, as shown by the string of chip-on-film elements. Thus, there are problems that the OLED display is damaged by a damage of the plastic substrate PI, and a defective driving of the OLED display occurs.

SUMMARY

Accordingly, the present disclosure is directed to a display device and a method of manufacturing the same that substantially obviate one or more of the issues due to limitations and disadvantages of the related art.

An aspect is to provide a display device capable of preventing a substrate from being damaged by an external impact.

Another aspect is to provide a display device capable of preventing a damage and a defective driving of the display device.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided a display device, including: a plastic substrate including: a display portion including organic light emitting diodes, and a pad portion including chip-on-films, a lower protective member attached to an entire lower surface of the plastic substrate, and an upper protective member attached to an upper surface of the plastic substrate, the upper protective member covering at least the display portion and both edges of the pad portion.

In another aspect, there is provided a method of manufacturing a display device, including: providing a plastic substrate including: providing a display portion including organic light emitting diodes, providing a pad portion, attaching chip-on-films to the pad portion, attaching a lower protective member to an entire lower surface of the plastic substrate, and attaching an upper protective member to an upper surface of the plastic substrate, the upper protective member covering at least the display portion and both edges of the pad portion.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

Figure 1:
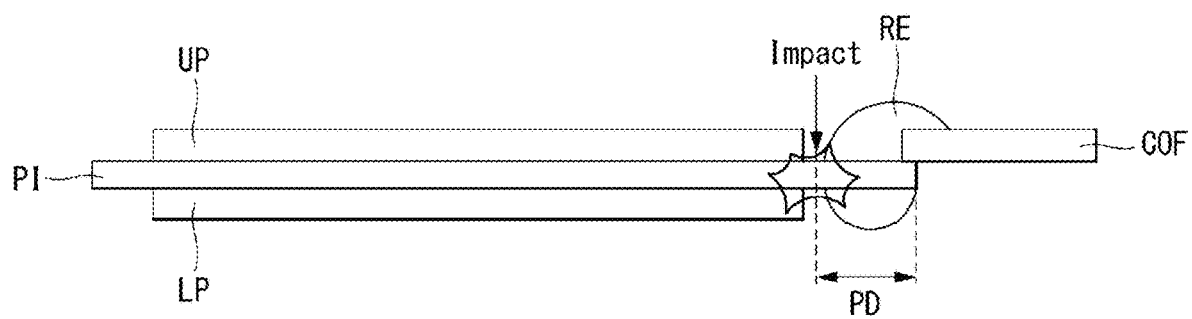
FIGS. 1 and 2 are cross-sectional views of an organic light-emitting diode (OLED) display according to a related art.
Figure 2:
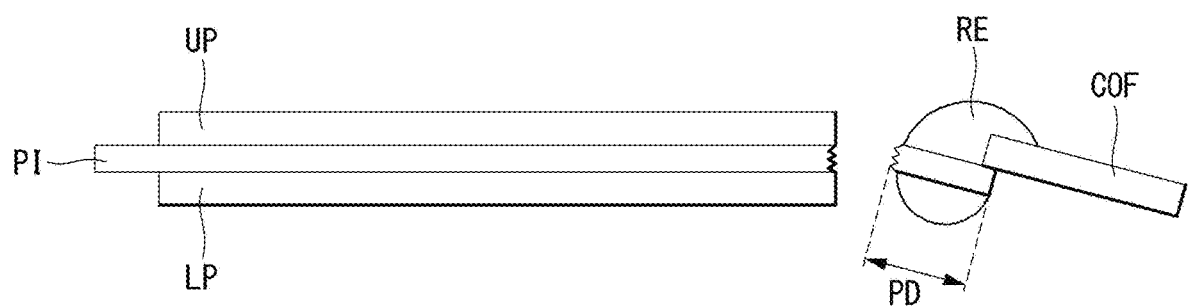
Figure 3:
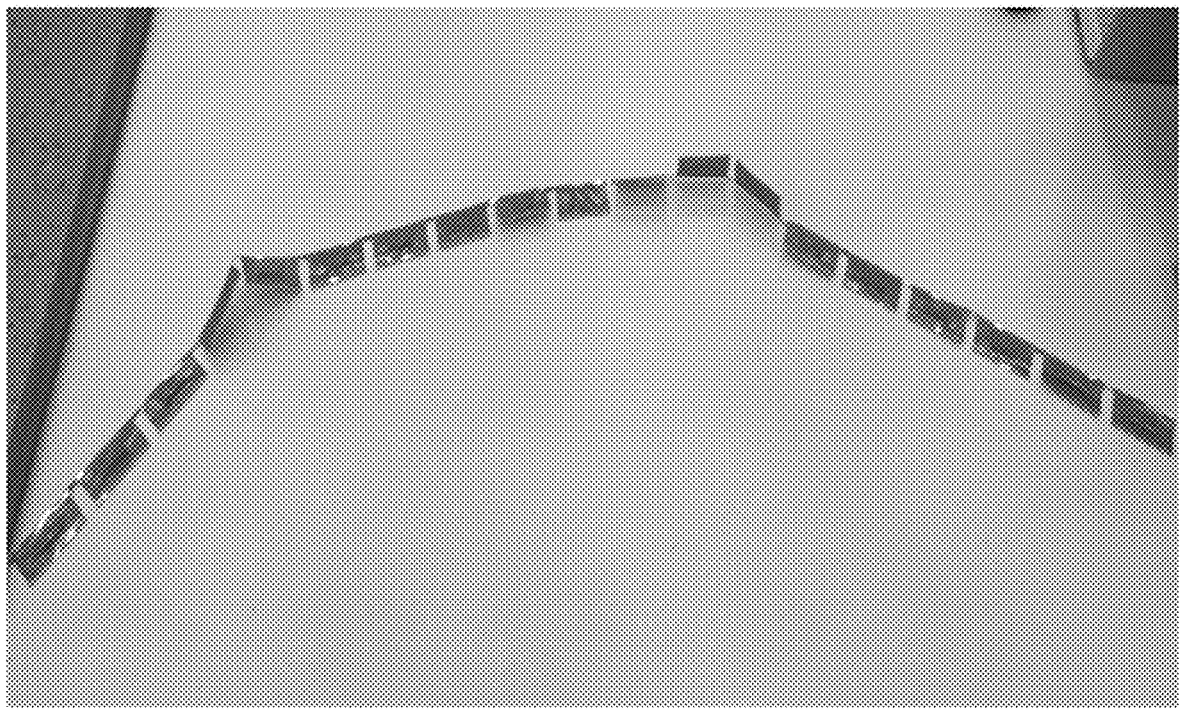
FIG. 3 is an image illustrating a damaged pad portion in a related art.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to some embodiments of the present disclosure, examples of that may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

Example embodiments are described below with reference to FIGS. 4 to 18.

Figure 4:
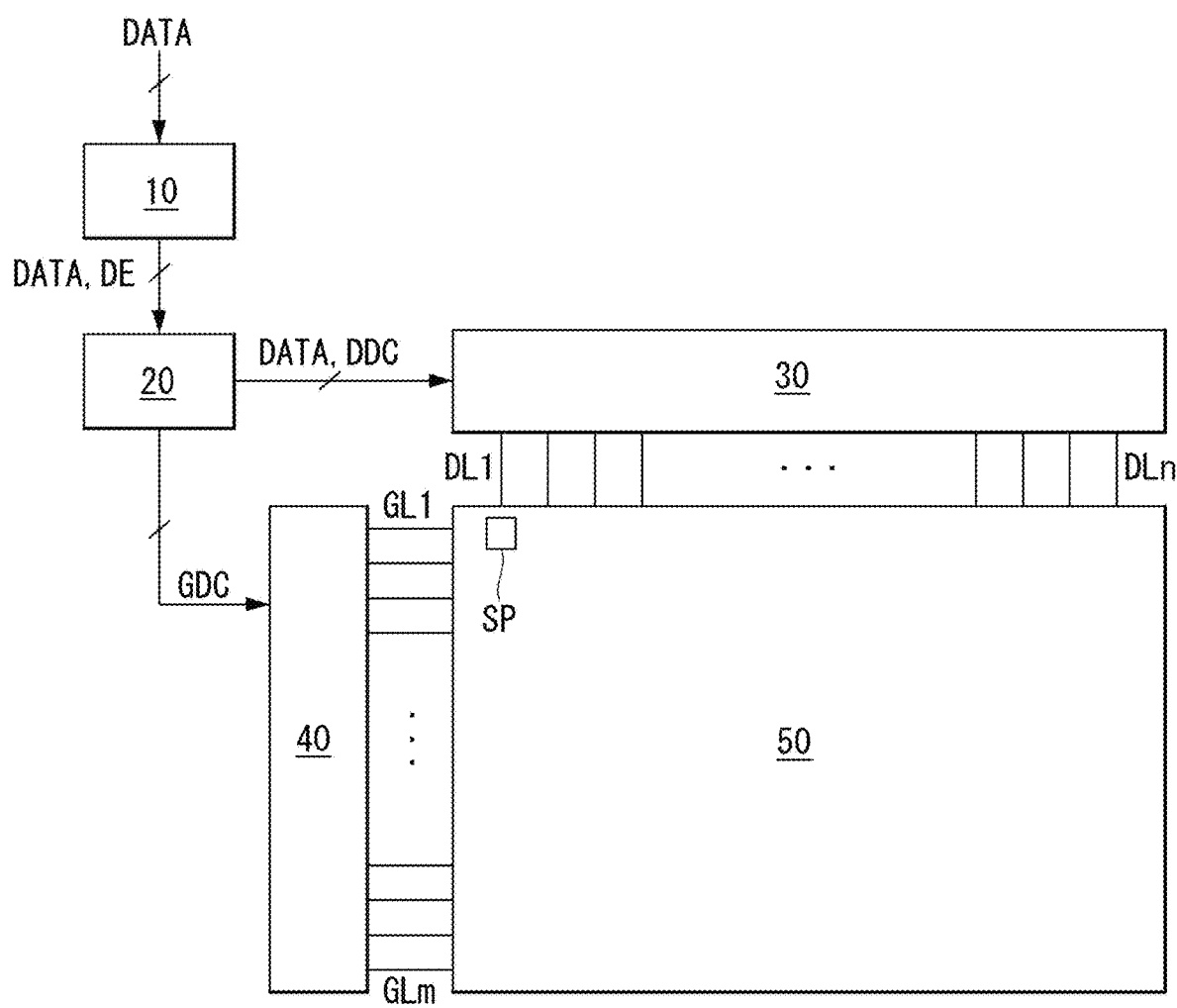
FIG. 4 is a schematic block diagram of an organic light-emitting diode (OLED) display according to an example embodiment.
Figure 5:
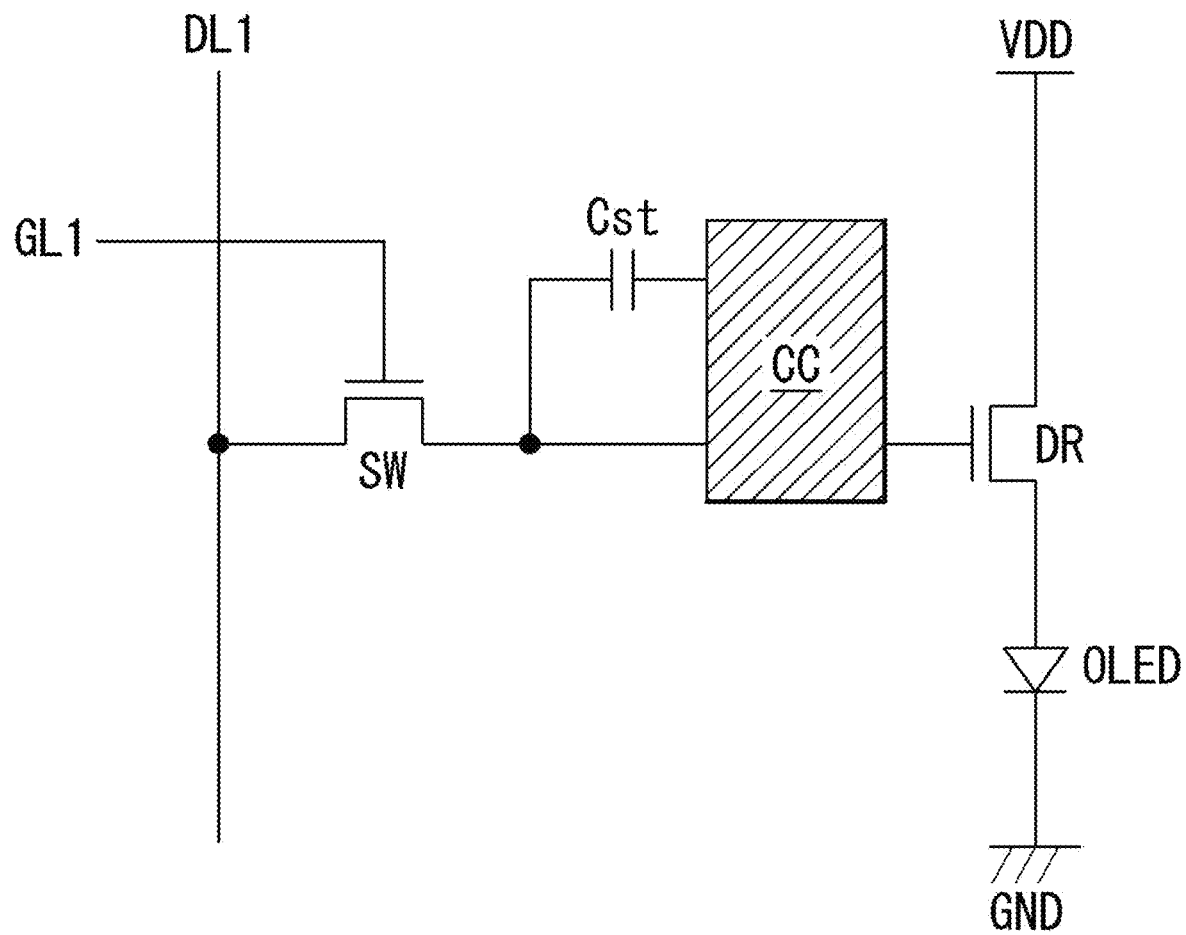
FIG. 5 illustrates a first example of a circuit configuration of a subpixel.
Figure 6:
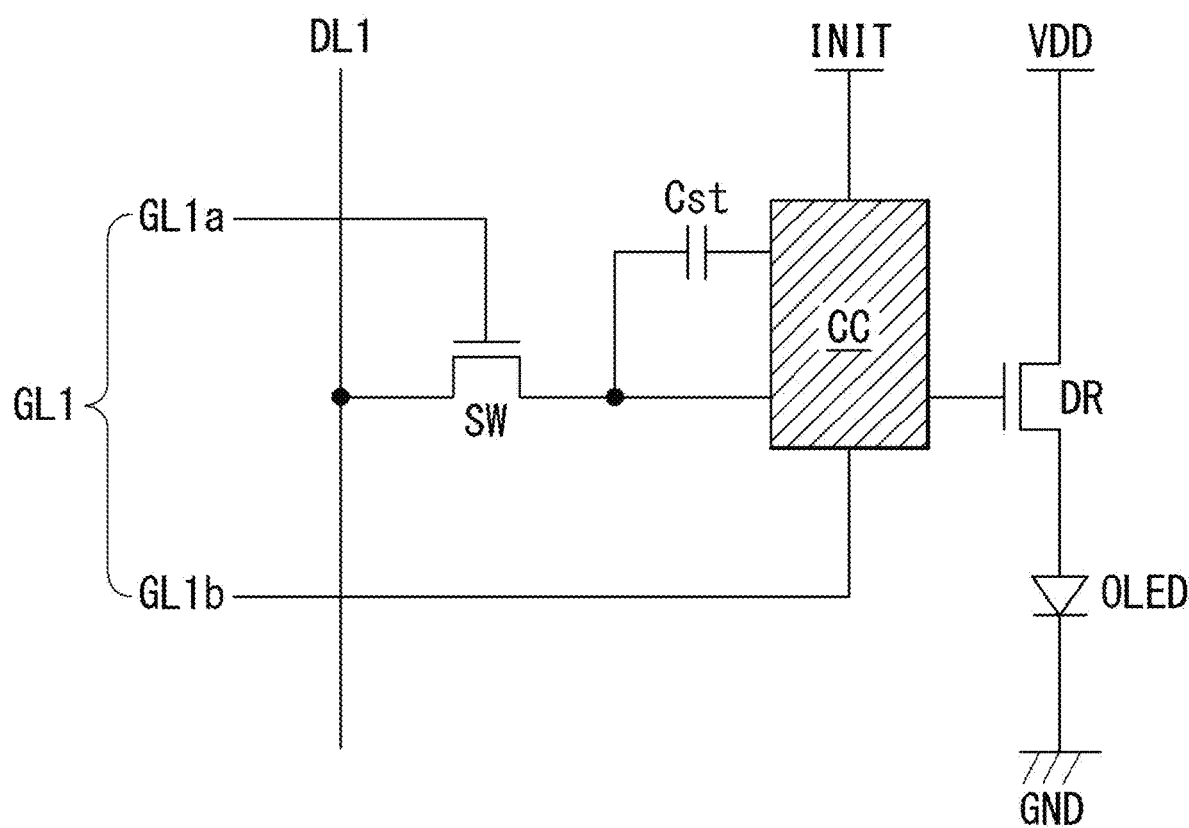
FIG. 6 illustrates a second example of a circuit configuration of a subpixel.

FIG. 4 is a schematic block diagram of an OLED display according to an example embodiment. FIG. 5 illustrates a first example of a circuit configuration of a subpixel. FIG. 6 illustrates a second example of a circuit configuration of a subpixel.

With reference to the FIG. 4 example, an OLED display according to an example embodiment may include an image processing unit 10, a timing controller 20, a data driver 30, a gate driver 40, and a display panel 50. The image processing unit 10 may output a data signal DATA and a data enable signal DE supplied from the outside. In addition to the data enable signal DE, the image processing unit 10 may output one or more of: a vertical sync signal, a horizontal sync signal, and a clock signal. For convenience of explanation, these signals are not shown. The image processing unit 10 may be formed on a system circuit board as an integrated circuit (IC).

The timing controller 20 may receive the data signal DATA and driving signals, including the data enable signal DE or the vertical sync signal, the horizontal sync signal, the clock signal, etc. from the image processing unit 10. Based on the driving signals, the timing controller 20 may output a gate timing control signal GDC for controlling operation timing of the gate driver 40, and a data timing control signal DDC for controlling operation timing of the data driver 30. The timing controller 20 may be formed on a control circuit board as an IC.

The data driver 30 may sample and latch the data signal DATA received from the timing controller 20 in response to the data timing control signal DDC supplied from the timing controller 20, and may convert the sampled and latched data signal DATA using gamma reference voltages. The data driver 30 may output the converted data signal DATA to data lines DL1 to DLn. The data driver 30 may be attached to a substrate as an IC.

The gate driver 40 may output a gate signal while shifting a level of a gate voltage in response to the gate timing control signal GDC supplied from the timing controller 20. The gate driver 40 may output the gate signal to gate lines GL1 to GLm. The gate driver 40 may be formed on a gate circuit board as an IC, or may be formed on the display panel 50 in a gate-in-panel (GIP) manner.

The display panel 50 may display an image in response to the data signal DATA and the gate signal respectively received from the data driver 30 and the gate driver 40. The display panel 50 may include subpixels SP for displaying an image.

As shown in the FIG. 5 example, each subpixel may include a switching transistor SW, a driving transistor DR, a compensation circuit CC, and an organic light-emitting diode (OLED). The OLED may operate to emit light based on a driving current generated by the driving transistor DR.

The switching transistor SW may perform a switching operation so that a data signal supplied through a first data line DL1 may be stored in a capacitor Cst as a data voltage in response to a gate signal supplied through a gate line GL1. The driving transistor DR may enable a driving current to flow between a high potential power line VDD and a low potential power line GND (not limited to a ground potential)

based on the data voltage stored in the capacitor Cst. The compensation circuit CC is a circuit for compensating for a threshold voltage of the driving transistor DR. A capacitor connected to the switching transistor SW or the driving transistor DR may be mounted inside the compensation circuit CC. The compensation circuit CC may include one or more thin film transistors (TFTs) and a capacitor. Configuration of the compensation circuit CC may be variously changed depending on a compensation method. A brief description of the compensation circuit CC will be made.

As shown in the FIG. 6 example, a subpixel including the compensation circuit CC may further include a signal line and a power line for driving a compensation TFT and supplying a predetermined signal or electric power. The gate line GL1 may include a first gate line GL1a supplying the gate signal to the switching transistor SW, and a second gate line GL1b for driving the compensation TFT included in the subpixel. The added power line may be defined as an initialization power line INIT for initializing a predetermined node of the subpixel to a predetermined voltage. However, this is merely an example, and embodiments are not limited thereto.

FIGS. 5 and 6 illustrate that one subpixel may include the compensation circuit CC by way of example. However, the compensation circuit CC may be omitted, for example, when an object (e.g., the data driver 30) to be compensated is positioned outside the subpixel. The subpixel may have a configuration of 2T(Transistor)1C(Capacitor) in which the switching transistor SW, the driving transistor DR, the capacitor, and the OLED are provided. However, when the compensation circuit CC is added to the subpixel, the subpixel may have various configurations, such as 3T1C, 4T2C, 5T2C, 6T2C, 7T2C, or the like. Also, FIGS. 5 and 6 illustrate that the compensation circuit CC may be positioned between the switching transistor SW and the driving transistor DR by way of an example. However, the compensation circuit CC may be further positioned between the driving transistor DR and the OLED. The position and the structure of the compensation circuit CC are not limited to the ones illustrated in FIGS. 5 and 6.

First Example Embodiment

Figure 7:
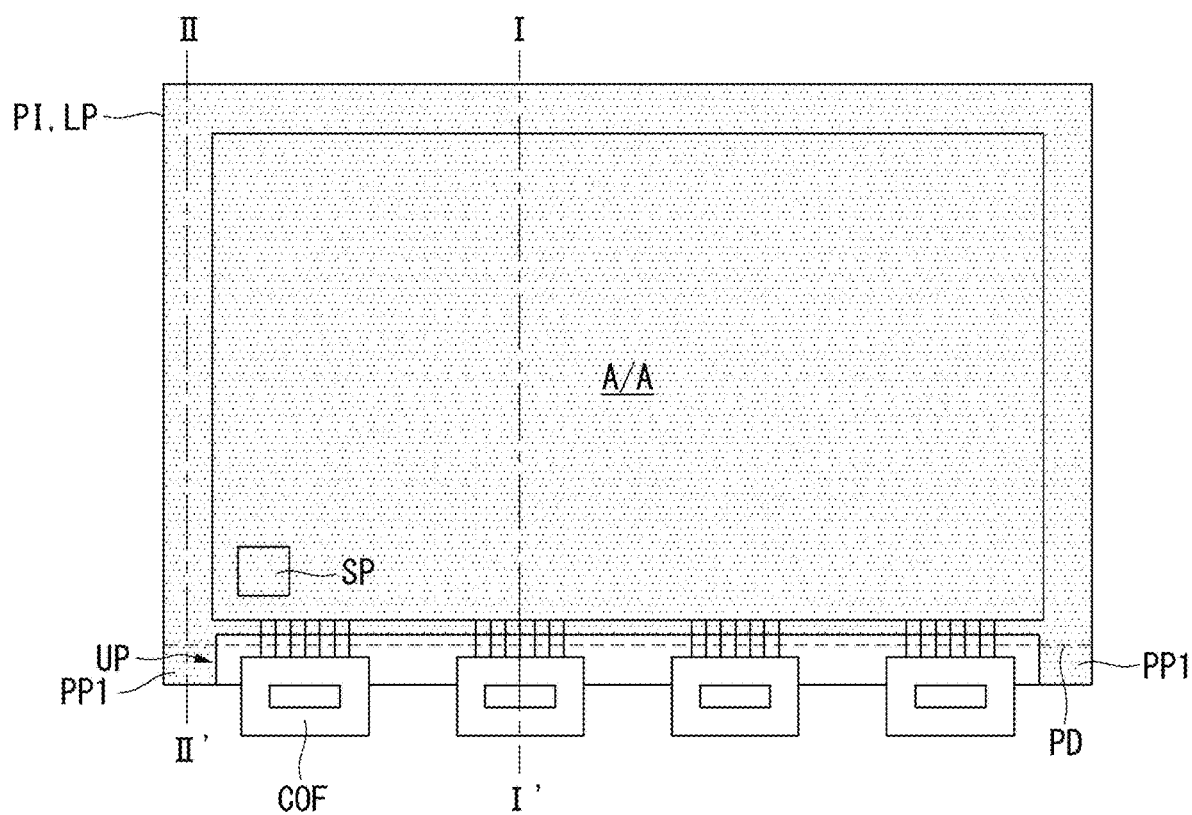
FIG. 7 is a plan view of an OLED display according to a first example embodiment.
Figure 8:
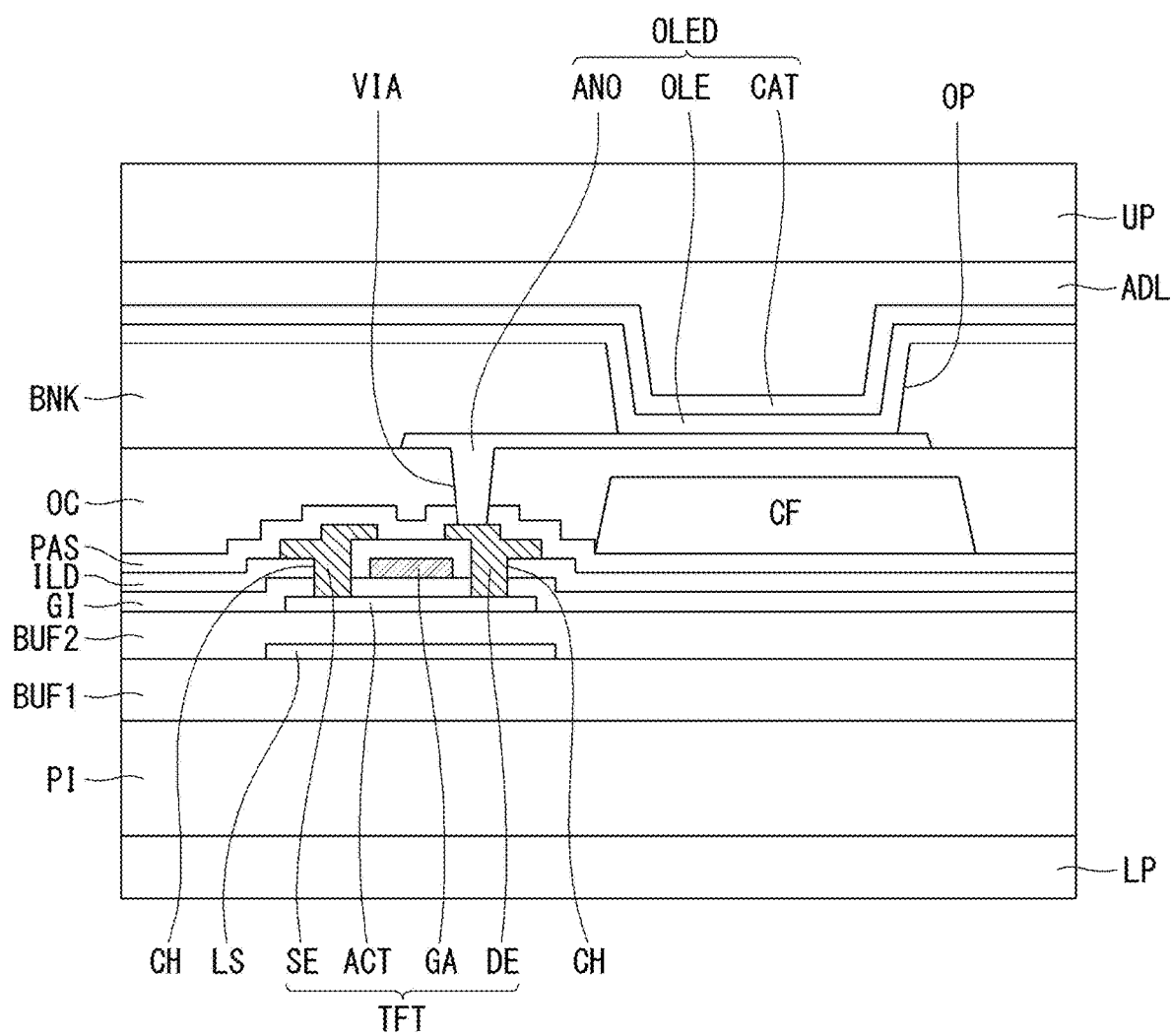
FIG. 8 is a cross-sectional view illustrating a subpixel of an OLED display according to a first example embodiment.
Figure 9:
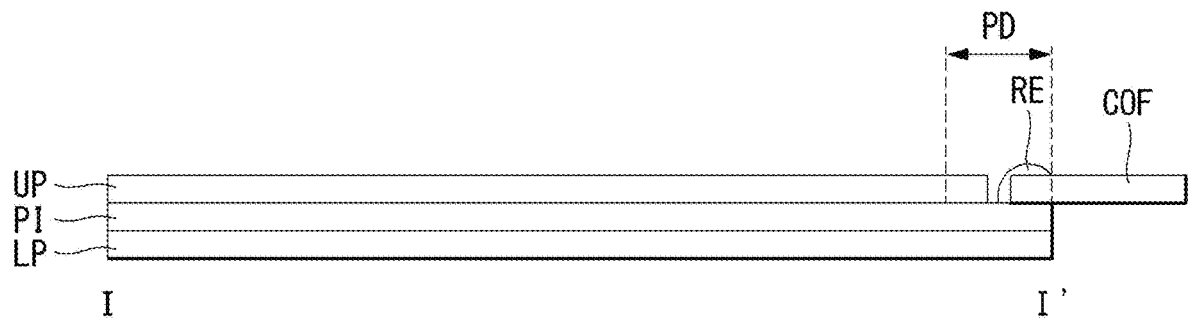
FIG. 9 is a cross-sectional view taken along line I-I' of FIG. 7.
Figure 10:
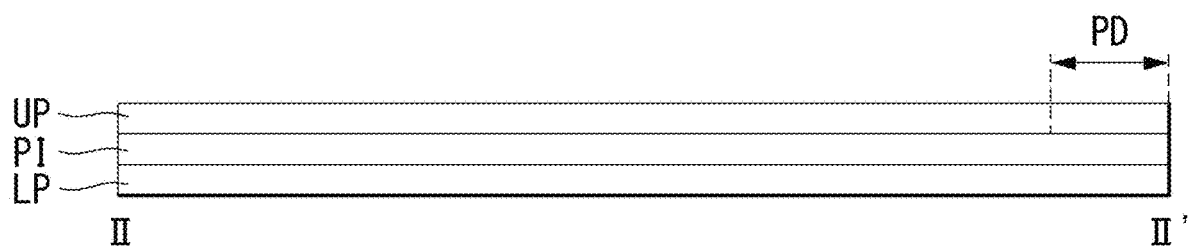
FIG. 10 is a cross-sectional view taken along line II-IF of FIG. 7.
Figure 11:
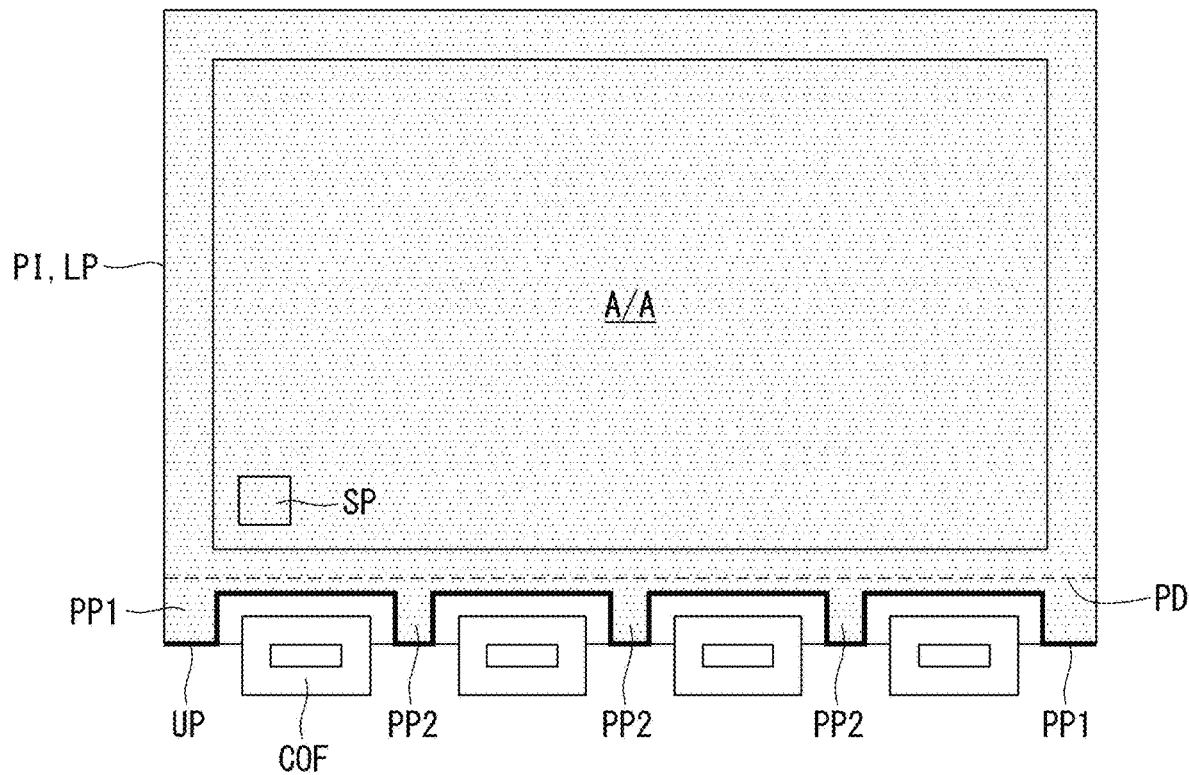
FIG. 11 is a plan view of an OLED display according to a first example embodiment.

FIG. 7 is a plan view of an OLED display according to a first example embodiment. FIG. 8 is a cross-sectional view illustrating a subpixel of an OLED display according to a first example embodiment. FIG. 9 is a cross-sectional view taken along line I-I' of FIG. 7. FIG. 10 is a cross-sectional view taken along line II-IF of FIG. 7. FIG. 11 is a plan view of an OLED display according to a first example embodiment.

With reference to the FIG. 7 example, an OLED display may include a plastic substrate PI, a display portion A/A, and a pad portion PD disposed on one side of the plastic substrate PI outside the display portion A/A. The display portion A/A may include a plurality of subpixels SP. For example, R (red), G (green), and B (blue) subpixels or R, G, B, and W (white) subpixels of the display portion A/A may emit light to represent the full color. Chip-on-films COF may be attached to the pad portion PD disposed on one side, for example, the lower side of the display portion A/A. A data signal and electric power may be applied to a plurality of signal lines (not shown) connected to the display portion A/A through the chip-on-films COF. Although not shown, the OLED display may further include a gate-in-panel (GIP) driver on one side of the plastic substrate PI.

A cross-sectional structure of a subpixel SP of the OLED display according to an embodiment is described below with reference to FIG. 8. As shown in the FIG. 8 example, in the OLED display according to an embodiment, a first buffer layer BUF1 may be positioned on the plastic substrate PI. The plastic substrate PI may be, for example, a polyimide substrate. Thus, the plastic substrate PI according to an embodiment may have flexible characteristics. The first buffer layer BUF1 may protect a thin film transistor, formed in a subsequent process from impurities, for example, alkali ions that may be discharged from the plastic substrate PI. The first buffer layer BUF1 may be, for example, a silicon oxide ($SiO_x$) layer, a silicon nitride ($SiN_x$) layer, or a multilayer thereof.

A shield layer LS may be positioned on the first buffer layer BUF1. The shield layer LS may prevent a reduction in a panel driving current, which may be generated by using a polyimide substrate. A second buffer layer BUF2 may be positioned on the shield layer LS. The second buffer layer BUF2 may protect a thin film transistor, formed in a subsequent process, from impurities, for example, alkali ions discharged from the shield layer LS. The second buffer layer BUF2 may be, for example, a silicon oxide ($SiO_x$) layer, a silicon nitride ($SiN_x$) layer, or a multilayer thereof.

A semiconductor layer ACT may be positioned on the second buffer layer BUF2, and may be formed of, e.g., a silicon semiconductor or an oxide semiconductor. The silicon semiconductor may include, for example, amorphous silicon or crystallized polycrystalline silicon. The polycrystalline silicon has a high mobility (for example, more than 100 $cm^2$/Vs), low power consumption, and excellent reliability. Thus, the polycrystalline silicon can be applied for a gate driver and/or a multiplexer (MUX) for use in a driving element or applied to a driving TFT of each pixel of the OLED display. Because the oxide semiconductor has a low OFF-current, the oxide semiconductor may be suitable for a switching TFT which has a short ON-time and a long OFF-time. Further, because the oxide semiconductor may increase a voltage hold time of the pixel due to the low OFF-current, the oxide semiconductor may be suitable for a display device requiring a low-speed drive and/or low power consumption. In addition, the semiconductor layer ACT may include a drain region and a source region, each including p-type or n-type impurities, and may also include a channel region between the drain region and the source region.

A gate insulating layer GI may be positioned on the semiconductor layer ACT, and may be formed of a silicon oxide ($SiO_x$) layer, a silicon nitride ($SiN_x$) layer, or a multilayer thereof. A gate electrode GA may be positioned on the gate insulating layer GI at a location corresponding to a predetermined region (e.g., the channel region when impurities are injected) of the semiconductor layer ACT. The gate electrode GA may be formed of, for example, one or more of: molybdenum (Mo), aluminum (Al), chromium (Cr), gold (Au), titanium (Ti), nickel (Ni), neodymium (Nd), copper (Cu), or a combination thereof. Further, the gate electrode GA may be a multilayer, which may be formed of, for example, one or more of: molybdenum (Mo), aluminum (Al), chromium (Cr), gold (Au), titanium (Ti), nickel (Ni), neodymium (Nd), copper (Cu), or a combination thereof. For example, the gate electrode GA may be formed as a double layer, e.g., of Mo/Al—Nd or Mo/Al.

An interlayer dielectric layer ILD may be positioned on the gate electrode GA, and may insulate the gate electrode GA. The interlayer dielectric layer ILD may be formed, for example, of a silicon oxide ($SiO_x$) layer, a silicon nitride ($SiN_x$) layer, or a multilayer thereof. Contact holes CH exposing a portion of the semiconductor layer ACT may be formed where each of the interlayer dielectric layer ILD and the gate insulating layer GI is formed.

A drain electrode DE and a source electrode SE may be positioned on the interlayer dielectric layer ILD. The drain electrode DE may be connected to the semiconductor layer ACT through the contact hole CH exposing the drain region of the semiconductor layer ACT. The source electrode SE may be connected to the semiconductor layer ACT through the contact hole CH exposing the source region of the semiconductor layer ACT. Each of the source electrode SE and the drain electrode DE may be formed as a single layer or as a multilayer. When each of the source electrode SE and the drain electrode DE is formed as the single layer, each of the source electrode SE and the drain electrode DE may be formed, for example, of one or more of: molybdenum (Mo), aluminum (Al), chromium (Cr), gold (Au), titanium (Ti), nickel (Ni), neodymium (Nd), copper (Cu), or a combination thereof. When each of the source electrode SE and the drain electrode DE is formed as the multilayer, each of the source electrode SE and the drain electrode DE may be formed, for example, as a double layer of, e.g., Mo/Al—Nd or as a triple layer of, e.g., Ti/Al/Ti, Mo/Al/Mo, or Mo/Al-Nd/Mo. Thus, a thin film transistor TFT including the semiconductor layer ACT, the gate electrode GA, the source electrode SE, and the drain electrode DE may be formed.

Further, a passivation layer PAS may be positioned on the plastic substrate PI including the thin film transistor TFT. The passivation layer PAS may be an insulating layer protecting the component underlying the passivation layer PAS, and may be formed, for example, of a silicon oxide (SiO$_x$) layer, a silicon nitride (SiN$_x$) layer, or a multilayer thereof. A color filter CF may be positioned on the passivation layer PAS. The color filter CF may convert white light emitted by an organic light-emitting diode OLED into red, green, or blue light. An overcoat layer OC may be positioned on the color filter CF. The overcoat layer OC may be a planarization layer for reducing a height difference (or step coverage) of an underlying structure, and may be formed, for example, of an organic material, such as polyimide, benzocyclobutene-based resin, and acrylate. For example, the overcoat layer OC may be formed through a spin-on-glass (SOG) method for coating the organic material in a liquid state, and then curing the organic material.

A via hole VIA exposing the drain electrode DE of the thin film transistor TFT may be positioned in a portion of the overcoat layer OC. The organic light-emitting diode OLED may be positioned on the overcoat layer OC. More specifically, a first electrode ANO may be positioned on the overcoat layer OC. The first electrode ANO may serve as a pixel electrode, and may be connected to the drain electrode DE of the thin film transistor TFT through the via hole VIA. The first electrode ANO may be an anode, and may be formed, for example, of a transparent conductive material, such as indium tin oxide (ITO), indium zinc oxide (IZO), and/or zinc oxide (ZnO). When the first electrode ANO is a reflective electrode, the first electrode ANO may further include a reflective layer. The reflective layer may be formed, for example, of one or more of: aluminum (Al), copper (Cu), silver (Ag), nickel (Ni), palladium (Pd), or a combination thereof. For example, the reflective layer may be formed of an Ag/Pd/Cu (APC) alloy.

In addition, a bank layer BNK defining pixels may be positioned on the plastic substrate PI including the first electrode ANO. The bank layer BNK may be formed of an organic material, such as polyimide, benzocyclobutene-based resin, and/or acrylate. The bank layer BNK may include a pixel definition portion OP exposing the first electrode ANO. An organic layer OLE contacting the first electrode ANO may be positioned at a front surface of the plastic substrate PI. The organic layer OLE may be a layer in which electrons and holes combine and emit light. A hole injection layer and/or a hole transport layer may be positioned between the organic layer OLE and the first electrode ANO. An electron injection layer and/or an electron transport layer may be positioned on the organic layer OLE.

A second electrode CAT may be positioned on the organic layer OLE, and may be positioned on an entire surface of the display area A/A (see the FIG. 4 example). In addition, the second electrode CAT may be a cathode electrode, and may be formed, for example, of one or more of: magnesium (Mg), calcium (Ca), aluminum (Al), silver (Ag), or a combination thereof, each having a low work function. When the second electrode CAT is a transmissive electrode, the second electrode CAT may be thin enough to transmit light. Further, when the second electrode CAT is a reflective electrode, the second electrode CAT may be thick enough to reflect light.

An upper protective member UP may be attached to an upper surface of the plastic substrate PI, on which the thin film transistor TFT and the organic light-emitting diode OLED may be formed, through an adhesive layer ADL. The upper protective member UP may be, for example, a transparent plastic substrate or a metal thin film. Further, a lower protective member LP may be attached to a lower surface of the plastic substrate PI. Because the lower protective member LP may have to transmit light, the lower protective member LP may be formed of a transparent plastic substrate.

With reference to the examples of FIGS. 7 to 9, the lower protective member LP may be disposed on the entire lower surface of the plastic substrate PI, and the upper protective member UP may be disposed on the upper surface of the plastic substrate PI. Because no component may be present on the lower surface of the plastic substrate PI, the lower protective member LP may be attached to the entire lower surface of the plastic substrate PI. Further, a resin layer RE may be disposed to cover the chip-on-films COF on the pad portion PD and the pad portion PD.

The pad portion PD may be positioned on the upper surface of the plastic substrate PI. The chip-on-films COF may be attached to the pad portion PD. The upper protective member UP may not be attached to a portion of the pad portion PD to which the chip-on-films COF are attached. Thus, the upper protective member UP may be disposed on the entire upper surface of the plastic substrate PI, except for a portion of the pad portion PD.

Because the upper protective member UP and the lower protective member LP positioned on and below the plastic substrate PI may cover the plastic substrate PI, the plastic substrate PI can be prevented from being damaged by an external impact. For example, in the related art, when the side of the plastic substrate PI may be most vulnerable to an impact, and may generate cracks, the impact may be propagated to elements inside the plastic substrate PI, thus causing damage of the display device. Thus, embodiments may cover the plastic substrate PI using the upper protective member UP and the lower protective member LP, thereby preventing damage of the plastic substrate PI.

As such, all the sides of the lower protective member LP may be formed to coincide with all the sides of the plastic substrate PI. For example, the lower protective member LP and the plastic substrate PI may have the same size. Hence, the lower protective member LP may be attached to the entire lower surface of the plastic substrate PI, and may cover the entire lower surface of the plastic substrate PI. In addition, the sides of the upper protective member UP may be formed to coincide with the sides of the plastic substrate PI, except for the side of the plastic substrate PI on which the pad portion PD may be formed.

With reference to the examples of FIGS. 7 and 10, in the first embodiment, the upper protective member UP may be disposed to cover both edges of the plastic substrate PI, even at the side on which the pad portion PD may be formed. As shown in FIG. 7, the plurality of chip-on-films COF may be attached to the pad portion PD, and edges of the plastic substrate PI may be positioned outside the left side and the right side of the pad portion PD, to which the chip-on-film COF may not be attached. The upper protective member UP may include first protrusions PP1 protruding to the pad portion PD. The first protrusions PP1 may be disposed to overlap the edges of the plastic substrate PI. Thus, the upper protective member UP may be disposed on the entire upper surface of the plastic substrate PI, except for a portion to which the chip-on-films COF may be attached. The upper protective member UP according to the embodiment may be disposed at both edges of the plastic substrate PI, even in the area in which the pad portion PD may be formed. Hence, even when the impact is applied to the edges of the plastic substrate PI, the upper protective member UP can prevent the plastic substrate PI from being torn out in the formation area of the pad portion PD.

As shown in the example of FIG. 11, as another example of the first embodiment, the lower protective member LP may be disposed on the entire lower surface of the plastic substrate PI. The upper protective member UP may be disposed to cover portions between both edges of the plastic substrate PI and the chip-on-films COF in the formation area of the pad portion PD.

The upper protective member UP may include first protrusions PP1 covering both edges at the side of the plastic substrate PI on which the pad portion PD is disposed, and second protrusions PP2 covering the plastic substrate PI between the chip-on-films COF. For example, the second protrusions PP2 may extend and protrude between the chip-on-films COF, and may be disposed to coincide with one side of the plastic substrate PI. Accordingly, the upper protective member UP may be disposed on the entire upper surface of the plastic substrate PI, except for a portion to which the chip-on-films COF may be attached, thereby preventing the plastic substrate PI positioned at the pad portion PD from being torn out when the impact is applied to the edge of the plastic substrate PI.

As described above, the display device according to the first embodiment may form the lower protective member LP on the entire lower surface of the plastic substrate PI and forms the upper protective member UP on the entire upper surface of the plastic substrate PI, except for a portion to which the chip-on-films COF may be attached, thereby preventing the plastic substrate PI from being damaged by the impact applied to the side of the plastic substrate PI. Thus, the first embodiment can prevent the damage and defective driving of the display device.

Second Example Embodiment

Figure 12:
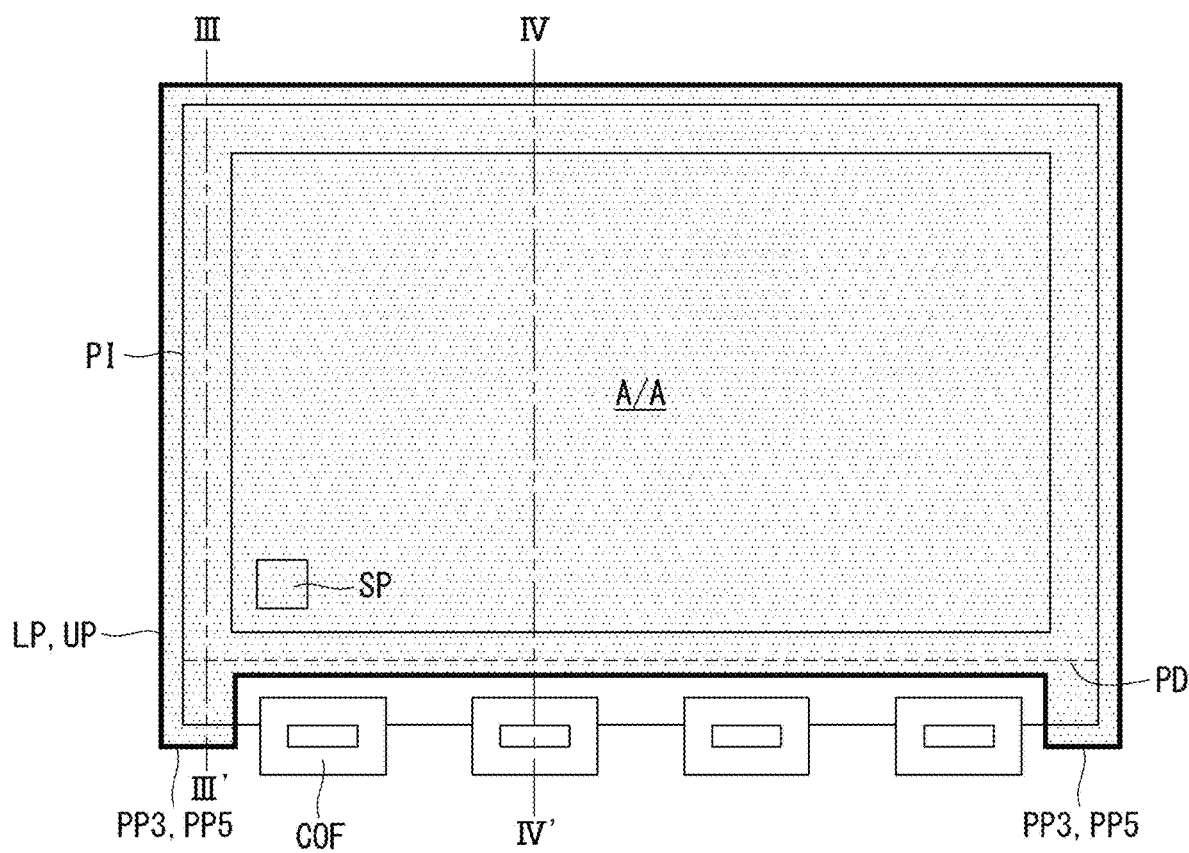
FIG. 12 is a plan view of a display device according to a second example embodiment.
Figure 13:
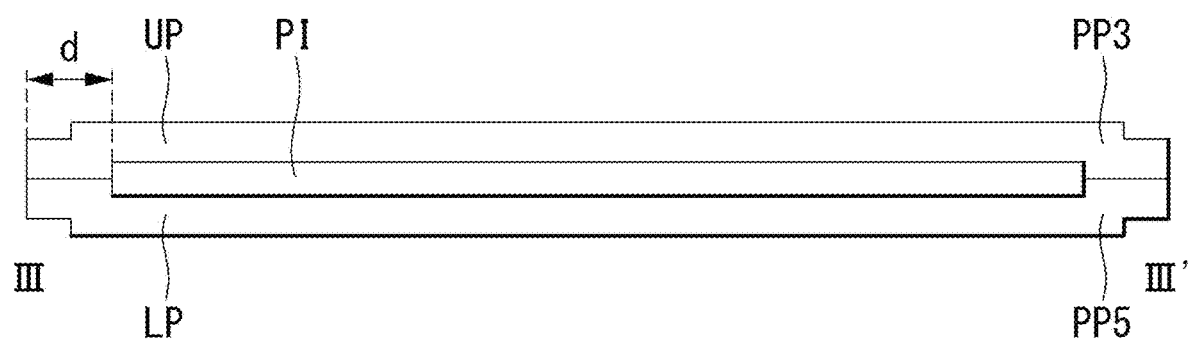
FIG. 13 is a cross-sectional view taken along line of FIG. 12.
Figure 14:
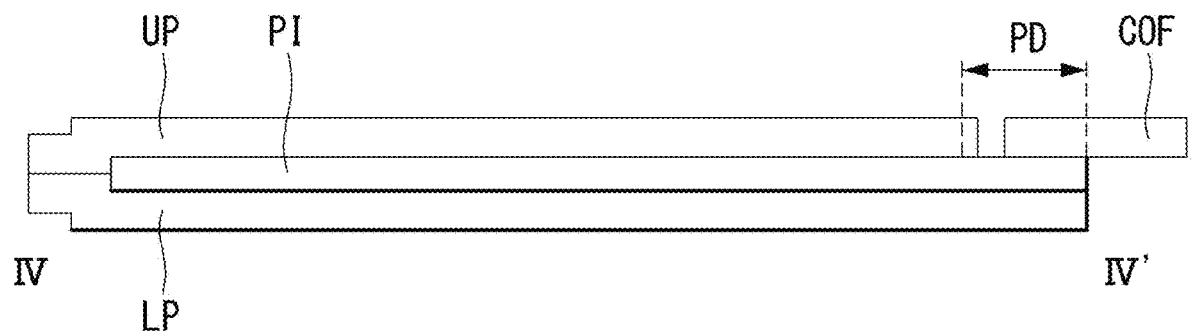
FIG. 14 is a cross-sectional view taken along line IV-IV' of FIG. 12.
Figure 15:
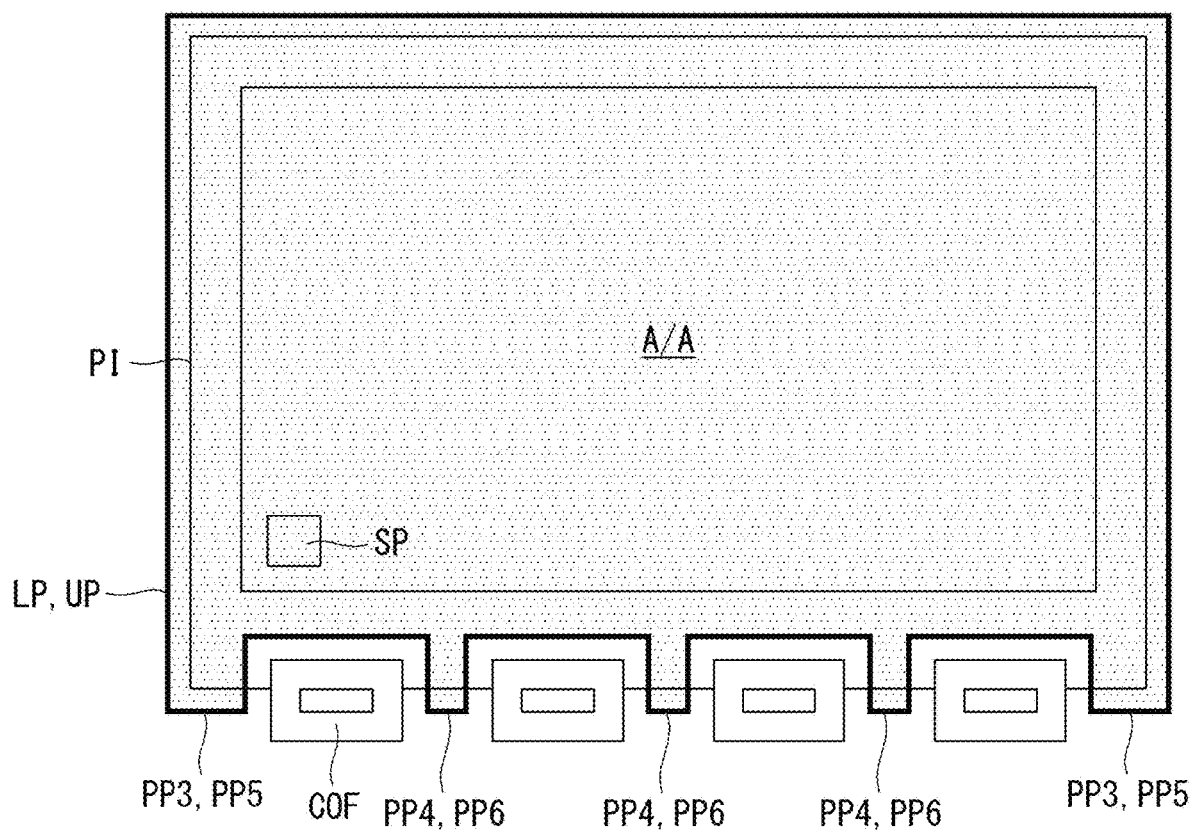
FIG. 15 is a plan view of a display device according to a second example embodiment.

FIG. 12 is a plan view of a display device according to a second example embodiment. FIG. 13 is a cross-sectional view taken along line of FIG. 12. FIG. 14 is a cross-sectional view taken along line IV-IV' of FIG. 12. FIG. 15 is a plan view of a display device according to a second example embodiment.

With reference to the examples of FIGS. 12 to 14, in the second embodiment, a lower protective member LP may be disposed on an entire lower surface of a plastic substrate PI, and an upper protective member UP may be disposed on an upper surface of the plastic substrate PI. Unlike the first embodiment, the lower protective member LP and the upper protective member UP may each have a size larger than the plastic substrate PI. Thus, the lower protective member LP and the upper protective member UP may completely cover the plastic substrate PI so that the sides of the plastic substrate PI may not be exposed to the outside, except for the side of the plastic substrate PI on which a pad portion PD may be formed.

For example, the pad portion PD may be disposed on the upper surface of the plastic substrate PI, and chip-on-films COF may be attached to the pad portion PD. The upper protective member UP may not be attached to a portion of the pad portion PD to which the chip-on-films COF are attached. Thus, the upper protective member UP may be disposed on the entire upper surface of the plastic substrate PI, except for a portion of the pad portion PD. Because the upper protective member UP may have the size larger than the plastic substrate PI as described above, the upper protective member UP may further protrude to the outside of the sides of the plastic substrate PI, except for the side on which the pad portion PD may be formed. For example, as shown in FIG. 12, the upper protective member UP may protrude further than the upper side, the left side, and the right side of the plastic substrate PI. In addition, as shown in the examples of FIGS. 12 to 14, the lower protective member LP may have a size larger than the plastic substrate PI as described above, but may be configured such that one side of the lower protective member LP may coincide with the lower side of the plastic substrate PI on which the pad portion PD may be formed. Thus, the lower protective member LP may protrude further than the remaining sides of the plastic substrate PI, except for the side of the plastic substrate PI on which the pad portion PD may be formed.

In the second embodiment, the upper protective member UP may cover both edges of the plastic substrate PI in the formation area of the pad portion PD, and may protrude further than the sides of the pad portion PD. As shown in the example of FIG. 12, the plurality of chip-on-films COF may be attached to the pad portion PD, and edges of the plastic substrate PI may be positioned outside the left side and the right side of the pad portion PD, on which the chip-on-film COF may not be attached. The upper protective member UP may include third protrusions PP3 protruding to the pad portion PD. The third protrusions PP3 may be disposed to overlap the edges of the plastic substrate PI. Thus, the upper protective member UP may be disposed on the entire upper surface of the plastic substrate PI, except for a portion to which the chip-on-films COF may be attached.

The lower protective member LP may cover both edges of the plastic substrate PI in the formation area of the pad portion PD, and may protrude further than the sides of the pad portion PD. The lower protective member LP may include fifth protrusions PP5 protruding to the pad portion PD. The fifth protrusions PP5 may be disposed to overlap the edges of the plastic substrate PI. Thus, the lower protective member LP may cover the entire lower surface of the plastic substrate PI, and may protrudes from all the sides of the plastic substrate PI, except for a portion to which the chip-on-films COF may be attached.

The upper protective member UP and the lower protective member LP protruding to the outside of the plastic substrate PI may be attached to each other using an adhesive layer, and the plastic substrate PI may be sealed, except for a portion of the pad portion PD. Further, the third protrusions PP3 of the upper protective member UP and the fifth protrusions PP5 of the lower protective member LP may be attached to each other. The upper protective member UP and the lower protective member LP protruding to the outside of the plastic substrate PI may protrude by a particular length. For example, as shown in the FIG. 13 example, lengths "d" of the upper protective member UP and the lower protective member LP protruding from the side of the plastic substrate PI may be equal to or greater than, e.g., 200 µm. Hence, an adhesive strength of the upper protective member UP and the lower protective member LP can increase, and the plastic substrate PI can be protected from an external impact. The upper protective member UP and the lower protective member LP according to the embodiment may be disposed at both edges of the plastic substrate PI, even in the area in which the pad portion PD may be formed. Hence, even when the impact is applied to the edges of the plastic substrate PI, the upper protective member UP and the lower protective member LP according to the embodiment can prevent the plastic substrate PI from being torn out in the formation area of the pad portion PD.

As described above, the upper protective member UP and the lower protective member LP may completely cover the plastic substrate PI so that most of the plastic substrate PI is not exposed to the outside, except for the formation area of the pad portion PD. Therefore, the upper protective member UP and the lower protective member LP can prevent the plastic substrate PI from being damaged by the external impact. For example, in the related art, when the side of the plastic substrate PI is most vulnerable to an impact and generates cracks, the impact may be propagated to elements inside the plastic substrate PI, causing damage of the display device. Thus, embodiments may cover the sides of the plastic substrate PI using the upper protective member UP and the lower protective member LP, thereby preventing damage of the plastic substrate PI.

As shown in the FIG. 15 example, as another example of the second embodiment, the upper protective member UP and the lower protective member LP may each have a size greater than the plastic substrate PI, and may be disposed to protrude to the outside of at least one side of the plastic substrate PI. For example, the upper protective member UP and the lower protective member LP may be disposed to cover portions between both edges of the plastic substrate PI and the chip-on-films COF in the formation area of the pad portion PD.

For example, the upper protective member UP may include third protrusions PP3 covering both edges at the side of the plastic substrate PI on which the pad portion PD is disposed, and fourth protrusions PP4 covering the plastic substrate PI between the chip-on-films COF. For example, the fourth protrusions PP4 may extend and protrude between the chip-on-films COF, and may be disposed to protrude to the outside of one side of the plastic substrate PI. Further, the lower protective member LP may include fifth protrusions PP5 covering both edges at the side of the plastic substrate PI on which the pad portion PD is disposed, and sixth protrusions PP6 covering the plastic substrate PI between the chip-on-films COF. For example, the sixth protrusions PP6 may extend and protrude between the chip-on-films COF, and may be disposed to protrude to the outside of one side of the plastic substrate PI.

Accordingly, the upper protective member UP and the lower protective member LP may seal the plastic substrate PI so that the sides of the plastic substrate PI may not be exposed to the outside throughout the plastic substrate PI, except for a portion to which the chip-on-films COF may be attached. Hence, even when the impact is applied to the edge of the plastic substrate PI, the upper protective member UP and the lower protective member LP can prevent the plastic substrate PI positioned at the pad portion PD or the edge of the plastic substrate PI from being torn out.

As described above, the display device according to the second embodiment may form the lower protective member LP having a larger size than the entire lower surface of the plastic substrate PI, and may form the upper protective member UP having a larger size than the entire upper surface of the plastic substrate PI, except for a portion to which the chip-on-films COF may be attached. Hence, the display device according to the second embodiment can prevent the plastic substrate PI from being damaged by the impact applied to the side of the plastic substrate PI, and can prevent the damage and the defective driving of the display device.

Figure 16:
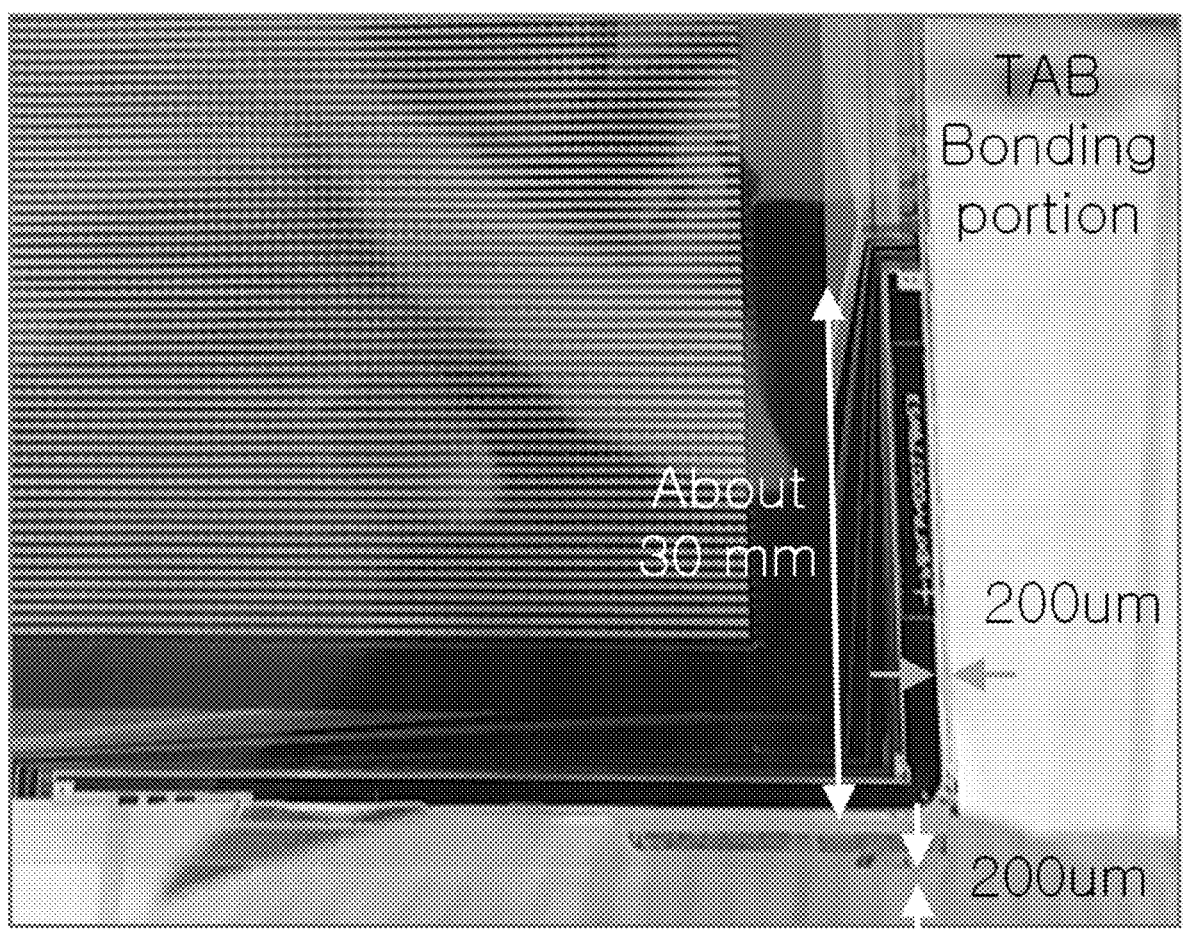
FIG. 16 is an image illustrating a display device according to an example embodiment used in an experiment.
Figure 17:
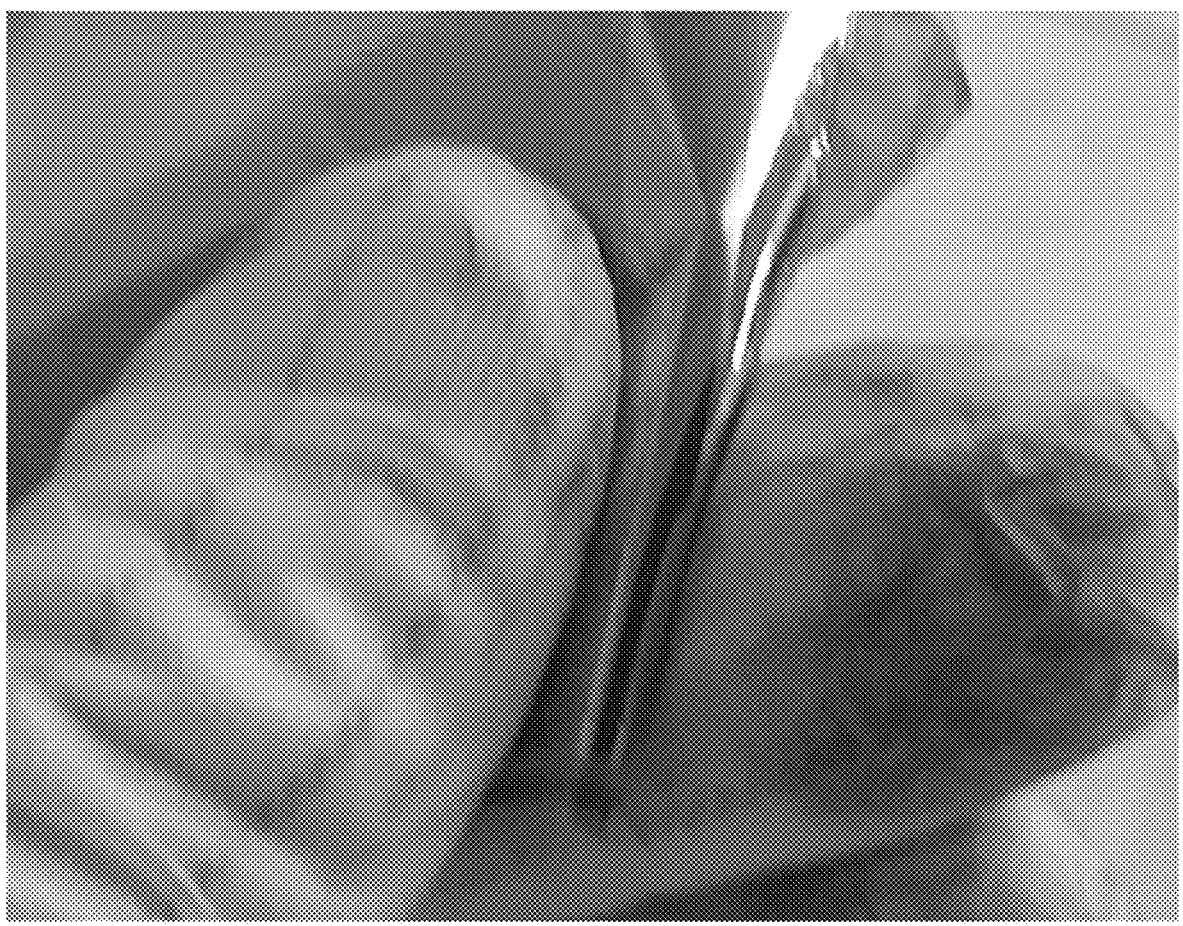
FIG. 17 is an image illustrating an experiment when an impact is applied to a display device according to an example embodiment.
Figure 18:
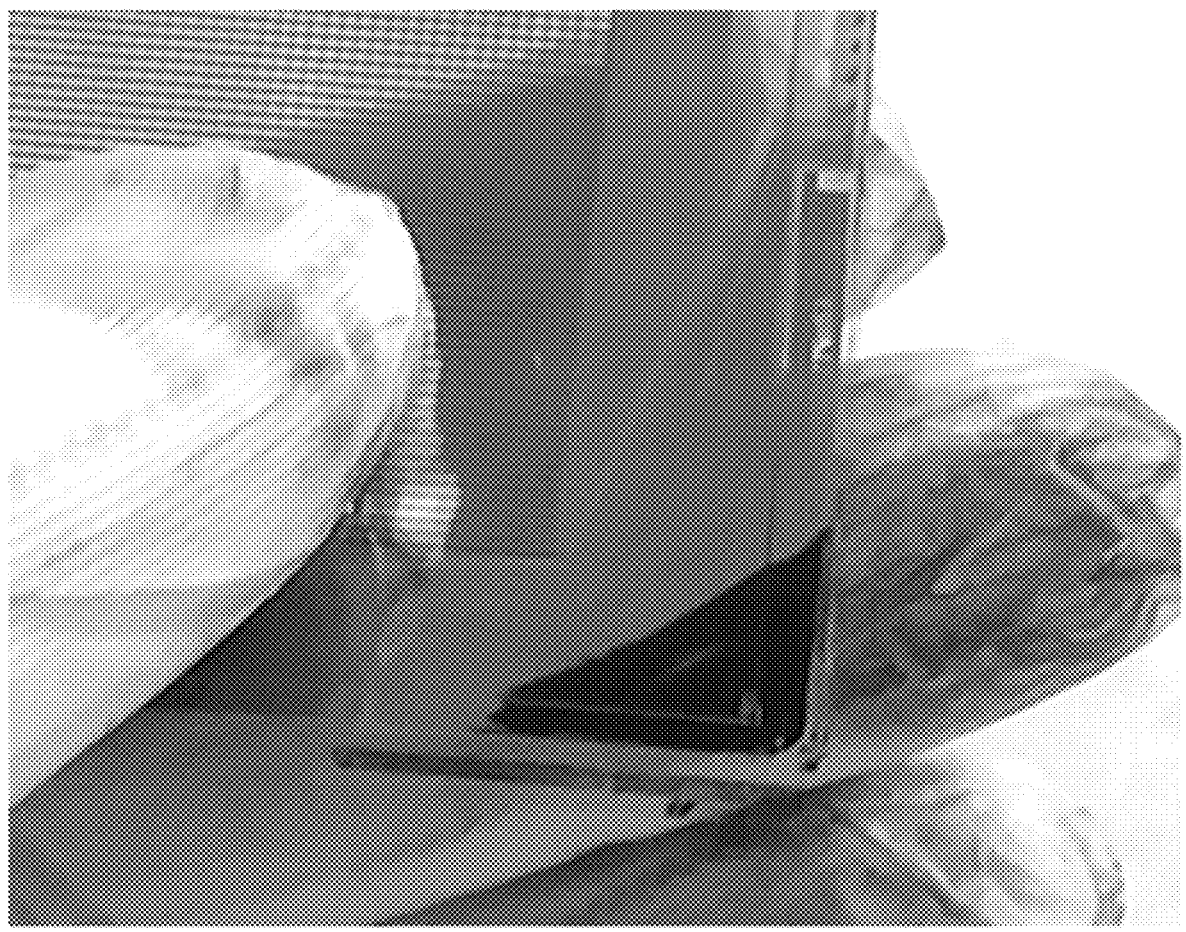
FIG. 18 is an image illustrating an experiment after an impact is applied to a display device according to an example embodiment.

FIG. 16 is an image illustrating a display device according to an example embodiment used in an experiment. FIG. 17 is an image illustrating an experiment when an impact is applied to a display device according to an example embodiment. FIG. 18 is an image illustrating an experiment after an impact is applied to a display device according to an example embodiment.

With reference to FIG. 16, in an experiment, protective members were respectively attached to an upper surface and a lower surface of a plastic substrate of a display device formed according to an example embodiment, on which an organic light-emitting diode was formed. In this instance, an upper protective member and a lower protective member were attached to the plastic substrate to protrude from the side of the plastic substrate by about 200 µm, and were attached to each other. For reference, the distance from one side of the PI substrate to the tab bonding portion is 30 mm.

As shown in FIG. 17, in an experiment, an impact was applied to the plastic substrate formed according to an example embodiment by bending an edge of the plastic substrate about twenty (20) times by hand. As shown in FIG. 18, even when the impact was applied to the plastic substrate, the damage, such as a crack, was not found at the edge of the plastic substrate formed according to an example embodiment.

As described above, the display device according to an embodiment may include the protective members, which may be respectively disposed on the upper surface and the lower surface of the plastic substrate to cover the edge of the pad portion, thereby preventing the plastic substrate from being damaged by the impact applied to the side of the plastic substrate. Thus, the display device according to an embodiment can prevent the damage and the defective driving of the display device.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:
1. A display device, comprising:
   a plastic substrate comprising:
     a display portion comprising organic light emitting diodes; and
     a pad portion;

chip-on-films attached to the pad portion;
a lower protective member attached to a first surface of the plastic substrate; and
an upper protective member attached to a second surface of the plastic substrate, the upper protective member covering at least the display portion and both lateral edges of the pad portion, and
wherein the chip-on-films extend beyond an outer edge of each of the upper protective member and the lower protective member,
wherein the upper protective member comprises a plurality of protrusions protruding, in a first direction from the pad portion away from the display portion, beyond a first side of the plastic substrate adjacent to the pad portion,
wherein the upper protective member is spaced apart from the chip-on films,
wherein the lower protective member comprises a plurality of protrusions corresponding to the protrusion of the upper protective member and protruding, in the first direction, beyond the first side of the plastic substrate, and
wherein the protrusions of the upper protective member do not extend beyond the corresponding protrusions of the lower protective member, respectively, in the first direction.

2. The display device of claim 1, wherein the protrusions of the upper protective member comprises a plurality of first protrusions covering both lateral edges of the pad portion.

3. The display device of claim 2, wherein the protrusions of the lower protective member further comprises a plurality of second protrusions covering both lateral edges of the pad portion.

4. The display device of claim 3, wherein:
the first and second protrusions are attached to each other;
the first and second protrusions cover the first side of the plastic substrate; and
the first and second protrusions are configured to prevent the plastic substrate from being damaged by an impact applied to the first side of the plastic substrate.

5. The display device of claim 3, wherein the upper protective member further comprises a plurality of third protrusions extended between the chip-on-films in the first direction.

6. The display device of claim 5, wherein the lower protective member further comprises a plurality of fourth protrusions extended between the chip-on-films in the first direction.

7. The display device of claim 6, wherein:
the third and fourth protrusions are attached to each other;
the third and fourth protrusions cover the first side of the plastic substrate between the chip-on-films; and
the third and fourth protrusions are configured prevent the plastic substrate and the chip-on-films from being damaged by an impact applied to the first side of the plastic substrate.

8. The display device of claim 1, wherein:
the upper protective member and the lower protective member each have a size greater than the plastic substrate;
the upper protective member and the lower protective member are disposed to protrude beyond four sides of the plastic substrate, including the first side, except where the chip-on-films are attached to the pad portion, and
the upper protective member and the lower protective member are attached to each other at the four sides of the plastic substrate and cover the four sides of the plastic substrate.

9. The display device of claim 1, wherein each of the chip-on-films adhered to the pad portion of the plastic substrate is exposed between adjacent protrusions of the upper protective member.

10. The display device of claim 1, further comprising a resin layer covering the chip-on-films and the pad portion.

11. The display device of claim 1, wherein the upper protective member is attached to the plastic substrate directly by an adhesive layer directly contacting an electrode of at least one of the organic light emitting diodes, the adhesive layer planarizing, and filling contours of the electrode.

12. The display device of claim 1, wherein:
only three sides of the chip-on films are surrounded by the upper protective member; and
the chip-on films do not overlap the upper protective member.

13. The display device of claim 4, wherein a width of an attached portion of the first and second protrusions, from the first side of the plastic substrate to the end of the first and second protrusions, is greater than or equal to 200 μm.

14. The display device of claim 4, wherein a width of an attached portion of the first and second protrusions, from the first side of the plastic substrate to the end of the first and second protrusions, is approximately 1/150 of a distance from the first side of the plastic substrate to a tab bonding portion.

15. The display device of claim 1, wherein the upper protective member does not directly contact the chip-on-films.

16. The display device of claim 15, wherein at least one of the chip-on-films includes a flexible printed circuit board, and
wherein the upper protective member does not directly contact the flexible printed circuit board.

17. The display device of claim 1, wherein the protrusions of the upper protective member are attached to the corresponding protrusions of the lower protective member, respectively.

18. The display device of claim 1, wherein the protrusions of the upper protective member respectively overlap and have a same respective shape as the corresponding protrusions of the lower protective member in a plan view.

* * * * *